United States Patent [19]

Ho et al.

[11] Patent Number: 4,812,191
[45] Date of Patent: Mar. 14, 1989

[54] METHOD OF FORMING A MULTILEVEL INTERCONNECTION DEVICE

[75] Inventors: Chung W. Ho, Monte Sereno; B. Y. Min, Cupertino, both of Calif.

[73] Assignee: Digital Equipment Corporation, Maynard, Mass.

[21] Appl. No.: 55,794

[22] Filed: Jun. 1, 1987

[51] Int. Cl.⁴ .......................... B32B 31/00; B44C 3/02
[52] U.S. Cl. .................................... 156/239; 156/247; 156/249; 156/344
[58] Field of Search ............... 156/631, 634, 160, 233, 156/239, 902, 249, 230, 240, 289, 344, 247, 307.4, 307.7; 427/98

[56] References Cited

U.S. PATENT DOCUMENTS

| | | |
|---|---|---|
| 3,471,631 | 10/1969 | Quintana . |
| 4,157,407 | 6/1979 | Peiffer ................................. 427/98 |
| 4,159,222 | 6/1979 | Lebow et al. ....................... 156/631 |
| 4,170,512 | 10/1979 | Flanders et al. ..................... 156/631 |
| 4,246,054 | 1/1981 | Nester . |
| 4,314,866 | 2/1982 | Webber .............................. 156/163 |
| 4,354,895 | 10/1982 | Ellis . |
| 4,372,804 | 2/1983 | Hanabusa et al. .................. 156/902 |
| 4,415,607 | 11/1983 | Denes ................................ 156/230 |
| 4,421,608 | 12/1983 | McBride . |
| 4,480,288 | 10/1984 | Gazdik et al. ...................... 156/902 |
| 4,517,051 | 5/1985 | Gazdik et al. . |
| 4,523,974 | 6/1985 | Duly et al. . |
| 4,604,160 | 8/1986 | Murakami et al. .................. 156/902 |
| 4,606,787 | 8/1986 | Pelligrino ........................... 156/902 |
| 4,650,545 | 3/1987 | Laakofs et al. ..................... 156/902 |

Primary Examiner—Merrell C. Cashion, Jr.
Attorney, Agent, or Firm—Finnegan, Henderson, Farabow, Garrett and Dunner

[57] ABSTRACT

A method of fabricating a high density electrical interconnection member by forming a composite interconnection from metallic conductors on cured liquid polymer resin on substrate. The resin is cured at an elevated temperature to form a solid dielectric layer. Successive metallic and dielectric layers form an interconnection subassembly with the coefficient of thermal expansion of the substrate being less than the subassembly. The temperature of the subassembly is lowered placing it in tension. A support member is adhered to the exposed surface of the subassembly and the substrate removed. Multiple subassemblies can be joined together physically and electricaly to form a complex device for interconnecting a plurality of integrated circuit chips for high performance computer applications.

19 Claims, 2 Drawing Sheets

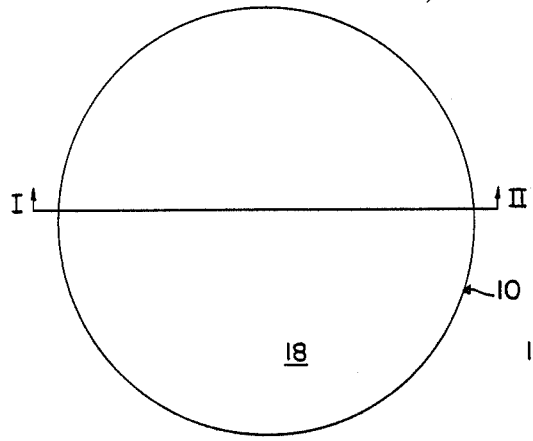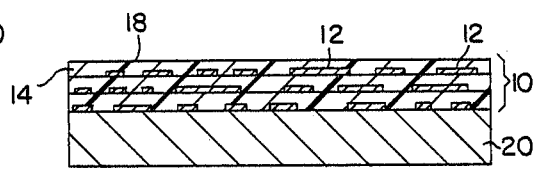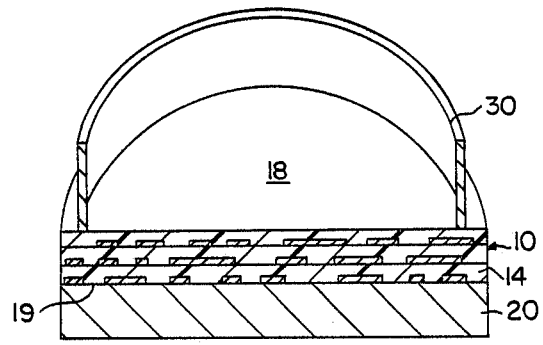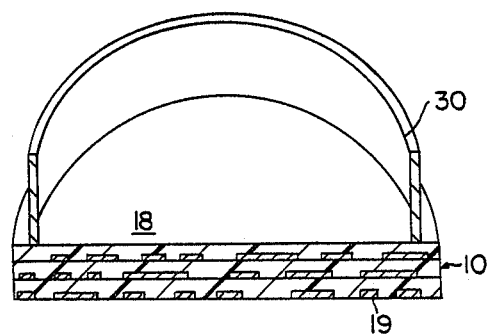

METHOD OF FORMING A MULTILEVEL INTERCONNECTION DEVICE

BACKGROUND OF THE INVENTION

1. Field of the Invention

This invention relates to a method of fabricating a high density electrical connecting structure.

2. Description of the Prior Art

The present invention provides a means of electrically interconnecting multiple electrical devices such as integrated circuits having multiple connections of high density with connection means that will allow high speed pulse propogation and high speed power supply through such interconnecting means. The approach utilizes a sacrificial substrate fabrication technique. While conventional printed circuit board connectors can provide some of the characteristics necessary for use in such devices, conventional printed devices cannot achieve the speed and density necessary to electrically interconnect multiple circuits of state of the art semiconductor devices. Furthermore, sacrificial substrate techniques have been developed to form high density layered fan out structures from integrated circuit chips to the chip carrier comprised of metallic conductors and polymer materials. U.S. Pat. No. 4,480,288 to Gazdik et al. discloses such a technique, as does U.S. Pat. No. 4,650,545 to Laakso et al.

The layered fan out structures formed by such techniques are for making short connections from the chip to the chip carrier which are not designed to interconnect a multiple of integrated circuit chips by providing signal and power distribution systems in the device and the fabrication process and the resultant structure are therefore considerably simpler.

Thus, it is one object of the invention to provide a method for fabricating separate but complex electrical interconnecting subassemblies as components of the final interconnection device to maximize yield whereby a subassembly may be tested and then, with the substrate removed but structurally supported after initial fabrication to prevent damage to the subassembly prior to its subsequent assembly to another subassembly, to form the desired interconnection device.

It is another object of the invention to provide a method for fabricating high density electrical interconnection suited for the interconnection of modern digital semiconductor devices.

It is a further object of the invention to provide a method for fabricating a multiple layer interconnection device.

It is an additional object of the invention to provide a method for fabricating a high density electrical interconnection in a manner such that conventional semiconductor wafer handling equipment can be used in the fabrication process.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

SUMMARY OF THE INVENTION

To achieve the foregoing objects, and in accordance with the purposes of the invention as embodied and broadly described herein, there is provided a method for fabricating a high density interconnection device where the device is fabricated by first forming a composite interconnection means from multilayers of thin film polymer resin such as polyimide and metallic conductors on a solid substrate. The resin is cured from an as-deposited liquid form at an elevated temperature to form a solid dielectric layer. A composite interconnection subassembly is fabricated after several dielectric and metallic films are deposited and patterned on the substrate. The substrate should have a coefficient of thermal expansion less than the subassembly. When the temperature of the subassembly and the substrate is lowered after the polymer resin is cured, thereby placing the subassembly in tension. Support means are adhered to the surface of the subassembly opposite the surface of the subassembly contacting the substrate. The substrate is then removed from the subassembly.

Preferably, two or more of such subassemblies are combined to form a layered device that may be electrically interconnected.

BRIEF DESCRIPTION OF THE DRAWINGS

The accompanying drawings, which are incorporated in and constitute a part of the specification, schematically illustrate a preferred embodiment of the invention and, together with the general description given above and the detailed description of the preferred embodiment given below, serve to explain the principles of the invention.

Of the drawings:

FIG. 1 is a top plan view of a subassembly fabricated on a disk-shaped substrate;

FIG. 2 is a schematic cross-sectional view of the embodiment of FIG. 1 showing a subassembly fabricated on a substrate;

FIG. 3 is a schematic cross section of the device of FIG. 1 with a ring-like supporting means affixed to one surface of the subassembly;

FIG. 4 is a schematic cross section of the device of FIG. 2 with the substrate removed;

DESCRIPTION OF THE PREFERRED EMBODIMENT

Figure 5:
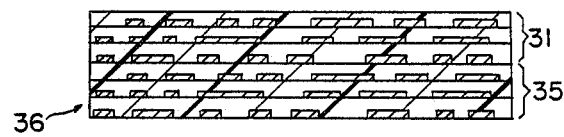
FIG. 5 is a schematic cross section of the subassembly laminated on top of another subassembly with the substrate of the latter removed. The final assembly is then ready for drilling and plating to interconnect them to form the final interconnection device.

The present invention will be disclosed in terms of a preferred embodiment. The preferred embodiment is an interconnection device for electrically interconnecting a number of semiconductor chips but the electrical interconnection may be used to electrically interface a number of different types of electrical devices.

The present invention finds particular utility in interconnecting components of high performance digital computers In such applications, size, constraints and performance characteristics of such computers create requirements for the interconnection device that may be achieved by the interconnection device disclosed herein. In such applications, the density of the connectors (the interconnect line pitch) is relatively high and may be in the range of from 50 to 100 microns or higher. In high performance digital computers, the interconnection device must include a signal core and a power core. The signal core must be capable of transmitting high speed pulse propogations and, therefore, should be constructed with a dielectric material having a low dielectric constant. Polymer materials, having an E value of from 2 to 4, are particularly suitable for such applications. The power core must be capable of supplying high speed power distribution with low inductance and thin dielectric layers ($10\mu$ or less) of polymer must be formed. Separate layered structures of polyimide and copper for signal and power cores have been formed to meet this need, however, as noted above, their fabrication can be quite complex and the final device yields can be extremely low if the subassembly approach is not used and the signal core and power core are fabricated sequentially in one long cycle.

In accordance with the invention, the first step of the method of fabrication of the high density electrical interconnection device of the present invention is forming a composite interconnection means from a liquid polymer resin and metallic conductors on a solid substrate. As here embodied and depicted schematically in FIG. 2, an interconnection subassembly 10, comprised of a number of conductors 12 disposed in a polymer matrix 14, is adhered to one surface of a substrate 20. The proportions of the various components are not to scale and are merely illustrative of the general configuration of such devices. In addition, the embodiment depicted has the subassembly 10 comprised of three layers, however, multiple layers of any feasible number may be fabricated to achieve the desired interconnection configuration.

Preferably, the solid substrate is of a size and shape like a semiconductor wafer material so that automated semiconductor fabrication equipment and techniques can be used. As here embodied, the substrate 20 is a disk-like member having a diameter and thickness approximating that of a wafer of semiconductor material. One technique of forming the interconnection layer(s) is to place liquid resin on such a substrate, spin the substrate to achieve a desired film thickness and the polymer is then cured. Metallic conductors are then placed in the cured film. Multiple steps to form a multi-layered device may be utilized.

In accordance with the invention, the resin is cured at an elevated temperature to form a solid, layered composite interconnection subassembly on the substrate. The substrate is comprised of a material having a coefficient of thermal expansion less than the subassembly. It should be noted that the coefficients of thermal expansion being referred to are the coefficients between the curing temperature and room temperature. One skilled in the art can readily select the substrate material in response to the thermal expansion coefficient characteristics of a laminated interconnection structure being fabricated thereon. Particular success has been achieved using a metal substrate such as aluminum, however, a substrate material such as silicon or copper may also be used.

Aluminum provides the benefit that a relatively thick interconnection may be fabricated on the substrate because of the close thermal expansion coefficient match between the substrate and a copper/polyimide interconnection subassembly. Such preferred embodiments allow the fabrication of a copper/polyimide structure having a thickness of approximately 100 microns or more with a high wiring density and a low defect rate.

In accordance with the invention, the temperature of the subassembly of the substrate is lowered from the curing temperature, thereby placing the subassembly in tension due to the different rates of contraction between the substrate and the subassembly. Alternatively, at an elevated temperature, support means such as a metal ring may be adhered to the surface of the substrate opposite the surface of the subassembly contacting the substrate. If the material comprising the support means has a coefficient of thermal expansion less than the subassembly, it will place the subassembly in tension upon cooling.

As embodied herein and depicted in FIG. 3, a ring-like support member 30 is affixed to the surface 18 of the subassembly 10 opposite the surface 19 contacting the substrate 20. Support member 30 stabilizes and controls the integrity of the layers in the subassembly.

In accordance with the invention, the substrate is removed from the subassembly. Preferably, removal of the substrate is done through an acid-etching process that removes the substrate leaving the interconnecting subassembly unaffected. As here embodied and depicted in FIG. 4, the surface 19 of the subassembly 10 is exposed, whereas in FIGS. 2 and 3 it was in contact with one surface of the substrate 20.

Figure 6:
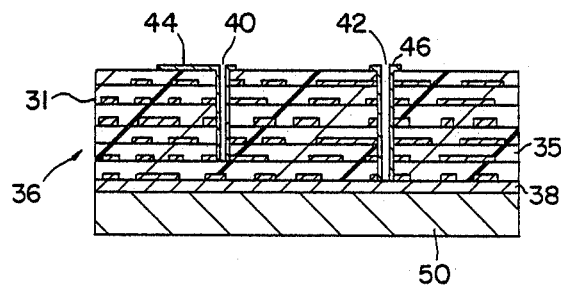
FIG. 6 is a schematic cross section of the assemblied device laminated into a base plate upon which integrated circuit devices can then be attached.

Thus, there is formed an interconnecting subassembly adherent to a support means in a state of tension. In such a state, the device can be adhered to an electrical device whereafter the support means can be removed. Alternatively, the layered subassembly, i.e., a signal core can be adhered to a second similar subassembly, i.e., a power core to form a layered composite interconnecting device and thereafter the supporting means removed. In such a variation, two devices such as those depicted in FIG. 4 would be adhered along the surface 19 of the layer 10 as shown in FIG. 5. In that embodiment two layers, 31 and 35, are joined to form a multilayered interconnection 36. The electrical connection between the two layers of the device can be accomplished by conventional drilling and plating techniques and the like as shown in FIG. 6. In that Figure, two layers, 31 and 35, are interconnected by the plating of holes 40 and 42 to form the interconnecting members 44 and 46. In FIG. 6 the multilayered interconnection 36 is mounted by an adhesive 38 to a baseplate 50, preferably comprised of a material having a coefficient of thermal expansion similar to a silicon chip (not shown). Molybdenum is particularly suited for such a baseplate. In such a manner, a high density interconnecting structure having dielectric properties capable of dealing with high speed pulse propogation can be economically manufactured on equipment designed for the fabrication of devices on semiconductor wafers.

The present invention has been described in terms of a preferred embdiment. The invention, however, is not limited to the embodiment depicted and described. The scope of the invention is defined by the appended claims and their equivalents.

What is claimed is:

1. A method for fabricating a high density electrical interconnection device, said method comprising the steps of:
    (a) forming a composite interconnection means from a iquid polymer resin and metallic conductors on a solid substrate;
    (b) curing said resin at an elevated temperature to form a solid layered composite interconnection subassembly on said substrate, said substrate having a coefficient of thermal expansion less than said subassembly;

(c) lowering the temperature of the subassembly and said substrate placing said subassembly in tension;

(d) adhering removable support means to the surface of said subassembly opposite the surface of said subassembly contacting said substrate to stabilize said subassembly; and (e) removing said substrate from said subassembly while the support means is adhered to the subassembly.

2. The method of claim 1 wherein said composite interconnection means has an interconnect line pitch in the range of from 50 to 100 microns.

3. The method of claim 1 wherein said substrate is disk-shaped. shaped.

4. The method of claim 1 wherein said substrate is comprised of silicon.

5. The method of claim 1 wherein said substrate is comprised of aluminum or copper.

6. The method of claim 1 wherein said liquid polymer resin cures in step (b) to form polyimide.

7. The method of claim 1 including the steps of adhering the subassembly of step (e) to a semiconductor device and removing said support means.

8. The method of claim 1 including the steps of adhering the subassembly of step (e) to a second subassembly to form a layered composite interconnection device and removing said support means.

9. The method of claim 1 wherein said support means comprises a metal ring.

10. A method for fabricating a high density electrical interconnection device, said method comprising the steps of:

(a) forming a composite interconnection means from a liquid polymer resin and metallic conductors on a solid substrate;

(b) curing said resin at an elevated temperature to form a solid layered composite interconnection subassembly on said substrate;

(c) adhering removable support means to the surface of said subassembly opposite the surface of said subassembly contacting said substrate, said support means having a coefficient of thermal expansion less that said subassembly;

(d) lowering the temperature of said subassembly, said support means and said substrate placing said subassemly in tension; and (e) removing said substrate from said subassembly while the support means is adhered to the subassembly.

11. The method of claim 10 wherein said composite interconnection means has an interconnect line pitch in the range of from 50 to 100 microns.

12. The method of claim 10 wherein said substrate is disk-shaped.

13. The method of claim 10 wherein said substrate is comprised of silicon.

14. The method of claim 10 wherein said substrate is comprised of aluminum or copper.

15. The method of claim 10 wherein said liquid polymer resin cures in step (b) to form polyimide.

16. The method of claim 10 including the steps of adhering the subassembly of step (e) to a semiconductor device and removing said support means.

17. The method of claim 10 including the steps of adhering the subassembly of step (e) to a second subassembly to form a layered composite interconnection device and removing said support means.

18. The method of claim 10 wherein said supporting means comprises a metal ring.

19. A method for fabricating a high density electrical interconnection device, the method comprising the steps of:

(a) placing liquid resin on a substrate;

(b) spinning the substrate to achieve a desired thickness of resin;

(c) curing the resin;

(d) placing metallic conductors in the cured resin to complete one layer in a subassembly;

(e) repeating steps (a)-(d) to form the desired number of layers in the subassembly;

(f) lowering the temperature of the subassembly and said substrate placing said subassembly in tension, said substrate having a coefficient of thermal expansion less than said subassembly:

(g) adhering removable support means to the surface of the subassembly opposite the surface of the subassembly contacting the substrate; and (h) removing the substrate from the subassembly while the support means is adhered to the subassembly.

* * * * *

UNITED STATES PATENT AND TRADEMARK OFFICE
CERTIFICATE OF CORRECTION

PATENT NO. : 4,812,191

DATED : March 14, 1989

INVENTOR(S) : Chung W. Ho et al.

It is certified that error appears in the above-identified patent and that said Letters Patent is hereby corrected as shown below:

Claim 1, column 4, line 64: change "iquid" to --liquid--.

Claim 3, column 5, line 17: delete "shaped." (2nd occurance).

In the Abstract, line 4: after "on" insert --a--.

Signed and Sealed this

Sixteenth Day of January, 1990

Attest:

JEFFREY M. SAMUELS

Attesting Officer    Acting Commissioner of Patents and Trademarks